United States Patent [19]

Van Eijk et al.

[11] Patent Number: 4,746,800
[45] Date of Patent: May 24, 1988

[54] POSITIONING DEVICE COMPRISING A Z-MANIPULATOR AND A θ-MANIPULATOR

[75] Inventors: Jan Van Eijk, Eindhoven; Marinus A. Van Den Brink, Veldhoven; Johannes M. M. Van Kimmenade, Veldhoven; Hubert A. M. Neilen, Veldhoven, all of Netherlands

[73] Assignees: ASM Lithography B.V., Veldhoven, Netherlands; U.S. Philips Corporation, New York, N.Y.

[21] Appl. No.: 910,101

[22] Filed: Sep. 22, 1986

[30] Foreign Application Priority Data

Mar. 27, 1986 [NL] Netherlands ............... 8600785

[51] Int. Cl.⁴ .............................................. G21K 5/10
[52] U.S. Cl. ................................. 250/442.1; 250/492.1
[58] Field of Search ............ 250/440.1, 442.1, 492.1, 250/492.2, 491.1; 353/100, 101

[56] References Cited

U.S. PATENT DOCUMENTS 3,684,904  8/1972  Galutvz et al. ............... 250/442.1
3,790,155  2/1974  Longamore ................... 250/442.1
3,887,811  6/1975  Liveszy ........................ 250/442.1
4,057,347  11/1977  Moriyama et al. ............... 355/67
4,506,154  3/1985  Scire ........................... 250/442.1
4,516,029  5/1985  Tucker ......................... 250/442.1

FOREIGN PATENT DOCUMENTS 0166499  1/1986  European Pat. Off. ......... 250/442.1

Primary Examiner—Bruce C. Anderson
Assistant Examiner—Paul A. Guss
Attorney, Agent, or Firm—Robert T. Mayer

[57] ABSTRACT

A positioning device for manipulation of objects, provided with an object holder (5) which is rotatable about an axis of rotation (θ) by means of a θ-manipulator and is displaceable by translation along a Z-axis coinciding with the axis of rotation (θ) by means of a Z-manipulator. The two manipulators are coupled to each other by means of a separator (17, 153) in such a manner that the θ-movement and the Z-movement are independent of each other. The positioning device is particularly suitable for manipulation of objects in the submicron range, such as takes place, for example, in optical lithographic devices according to the invention.

11 Claims, 7 Drawing Sheets

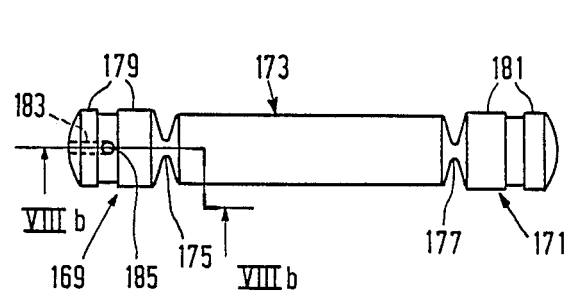
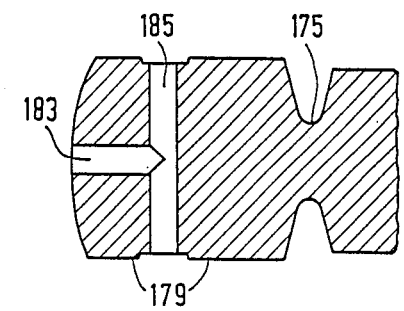
FIG.8a  FIG.8b
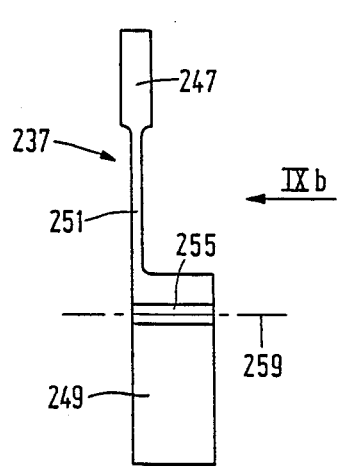
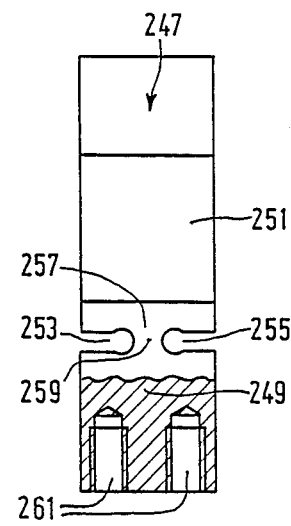
FIG.9a  FIG.9b
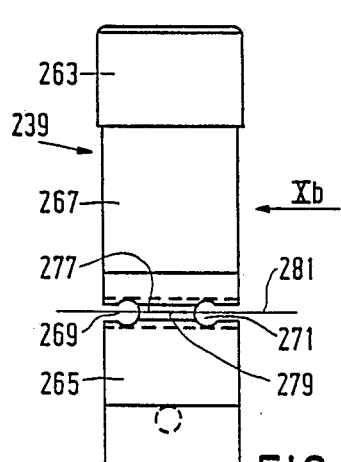
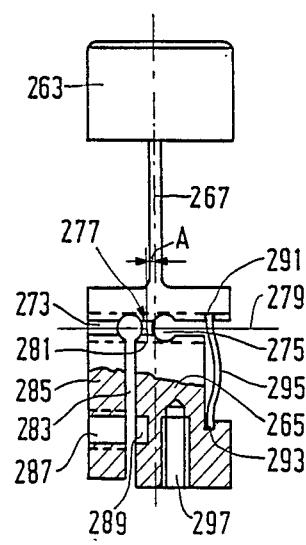
FIG.10a  FIG.10b

POSITIONING DEVICE COMPRISING A Z-MANIPULATOR AND A θ-MANIPULATOR

The invention relates to a positioning device comprising a Z-manipulator, which comprises a second support which is rotatable about an axis of rotation (θ) with respect to a first support. An object holder which is displaceable by means of the Z-manipulator in one (Z) of three coordinate directions of an orthogonal coordinate system is (X,Y,Z) connected to one of the supports by a substantially friction-less and hysteresis-free translatory movement. The object holder is also rotatable substantially friction-less and hysteresis-free by means of a θ-manipulator about the axis of rotation (θ) coinciding with the Z-axis. The two supports are secured to each other by first elastic coupling members and one of the two supports occupies a fixed position along the Z-axis of the coordinate system (X,Y,Z).

The invention further relates to an optical lithographic device provided with the positioning device.

In a known positioning device of the kind mentioned in the opening paragraph (described in the book "Lösungskataloge für Sensoren" of R. Breitinger, 1976, p. 60, ISBN 3-7830-0111-0), the translatory movement in the Z-direction of a shaft connected to the first support (object holder) is obtained by rotation of the first support about the axis of rotation (θ) coinciding with the Z-axis with respect to the fixedly arranged second support. This second support is connected through three obliquely arranged blade springs to the first support. Such a positioning device is known in practice as a Tomlinson element.

A disadvantage of the known positioning device is that the Z-translation and the θ-orientation cannot be performed independently of each other. The field of use of the known positioning device is thus comparatively limited.

The invention has for its object to provide a positioning device, by means of which a translation of the object holder in the Z-direction is possible without a simultaneous rotation of the object holder about the axis of rotation θ and by means of which a rotation of the object holder about the axis of rotation θ is possible without a simultaneous translation in the Z-direction, while also a simultaneous translation in the Z-direction and a rotation independent thereof about the axis of rotation θ can be performed.

For this purpose, the invention is characterized in that the Z-manipulator is coupled through a separator elastically deformable in the direction of the Z-axis to the θ-manipulator, by which in the absence of a translation along the Z-axis the object holder is rotatable about the axis of rotation θ, said separator upon relative rotation of the first support with respect to the second support producing due to elastic deformation of the first elastic coupling members a translation of the object holder in the direction of the Z-axis in the absence of a rotation of the object holder about the axis of rotation (θ).

It should be noted that a positioning device is known from U.S. Pat. No. 3,887,811 which forms part of a so-called electron beam pattern generator for the manufacture of integrated semiconductor circuits. The positioning device has a mechanism for displacement in the Z-direction and a substantially frictionless and hysteresis-free θ-manipulator. Both the Z-mechanism and the θ-manipulator serve for positioning an object holder with a mask or semiconductor substrate. The Z-movement is independent of the θ-movement. The Z-mechanism comprises a sliding shaft, which can be displaced in the Z-direction under spring force of an elastic bellows and is therefore not suitable for micromanipulation in the Z-direction because of play, friction and hysteresis caused by the sliding shaft and the bellows. The electron beam is therefore focused by means of focusing coils.

A particular embodiment of the positioning device having a simply constructed mechanically stable separator is characterized in that the separator has a flat ring, which is secured to the θ-manipulator and the centre of which lies on the Z-axis, which is at right angles to a plane through the ring, this ring being connected through flexible spokes in the form of a blade spring to a fixedly arranged part of the positioning device and preventing a relative rotation about the axis of rotation (θ) of a section of the Z-manipulator with respect to a section of the θ-manipulator.

A further embodiment of the positioning device, in which both for the manufacture of the Z-manipulator and for the manufacture of the θ-manipulator use may be made of corresponding technologies, is further characterized in that the θ-manipulator is supported by the Z-manipulator, while the first support of the Z-manipulator has an inner section, which is rotatable with respect to a fixedly arranged outer section and is connected through first elastic pivots deformable solely in a plane at right angles to the Z-axis to the outer section, the inner section, the outer section and the first elastic pivots being made of one piece of plate metal as an integral construction, which inner section is connected through the first elastic coupling members to the second support, which is arranged above the first support and is secured by means of the separator on the one hand to the fixedly arranged outer section of the first support and on the other hand to an inner section of a third support arranged above the second support, said third support further having an outer section, which is secured through second coupling members to the object holder and is connected through second elastic pivots deformable solely in a plane at right angles to the Z-axis to the relevant inner section, the third support acting as the θ-manipulator being made of one piece of plate metal as an integral construction.

A further embodiment of the positioning device, in which statically overconstrained constructions in the Z-manipulator are avoided, is characterized in that the first elastic coupling members between the first and the second support of the Z-manipulator are in the form of a circular-cylindrical rod and are provided near their two ends with an elastic pivot, while the ends of the first elastic coupling members are secured in bores of the first and second supports, whose centre line encloses an acute angle with a line perpendicular to the respective support and is parallel to the Z-axis.

A still further embodiment of the positioning device, in which a tilting movement of the object holder can be obtained about axes which lie in a plane at right angles to the Z-axis, is characterized in that the second coupling members between the third support and the object holder are elastically deformable and are constituted by three blade springs, which are all provided with a first elastic pivot, whose pivot shaft is at right angles to the plane of the blade spring, while two of the three blade springs are additionally provided with a second elastic pivot, whose pivot shaft is parallel to the plane of the blade spring and crosses its centre line perpendicularly.

Still a further embodiment of the positioning device, in which a substantially pure torque is transmitted by the actuation members to the Z-manipulator and the $\theta$-manipulator, is characterized in that a translation of the object holder along the Z-axis takes place by means of a first actuation member and a rotation of the object holder about the axis of rotation ($\theta$) takes place by means of a second actuation member, these actuation members each comprising two blade springs, which lie in planes intersecting each other along a line parallel to the Z-axis, while ends of each pair of blade springs facing each other are clamped in a fixedly arranged frame and ends of each pair of blade springs directed away from each other are secured to a bridge which is displaceable in a direction tangential to a circle, whose centre lies on the said line of intersection parallel to the Z-axis, said bridges being connected to sections of the Z-manipulator and the $\theta$-manipulator, respectively, rotatable about the axis of rotation ($\theta$) by means of each time two plates secured parallel to each other, whose plane is at right angles to the Z-axis.

An opical lithographic device for the manufacture of integrated circuits, in which the properties of the positioning device according to the invention become manifest in a special manner, is characterized in that the object holder is provided with a mask support, an engagement surface of which is at right angles to an optical axis coinciding with the Z-axis of an optical projection lens arranged in a lens holder fixedly arranged and secured to the outer section of the first support of the Z-manipulator, said optical lithographic device comprising, viewed in the direction of projection, in order of succession a light source, a diaphragm, a condensor lens, the said positioning device, the said projection lens and an X,Y table arranged below the projection lens for the translation in the X- and Y-direction for repeated exposure of a substrate.

The invention will be described more fully with reference to the drawing, in which:

FIG. 1 shows diagrammatically a first embodiment of a positioning device according to the invention, FIG. 2 shows diagrammatically a second embodiment of a positioning device according to the invention, FIG. 3 shows diagrammatically a third embodiment of a positioning device according to the invention, FIG. 4 shows in perspective view an embodiment of the positioning device according to the principle of FIG. 1 and suitable for use in an optical lithographic device, FIG. 5 shows diagrammatically an optical lithographic device according to the invention provided with a positioning device according to the invention, FIG. 6 shows the first support of the Z-manipulator in a positioning device as shown in FIG. 1 and FIG. 4.

FIG. 8 shows the coupling members of the Z-manipulator,

FIG. 9 shows a first kind of coupling members of the $\theta$-manipulator.

FIG. 10 shows a second kind of coupling members of the $\theta$-manipulator.

Figure 1:
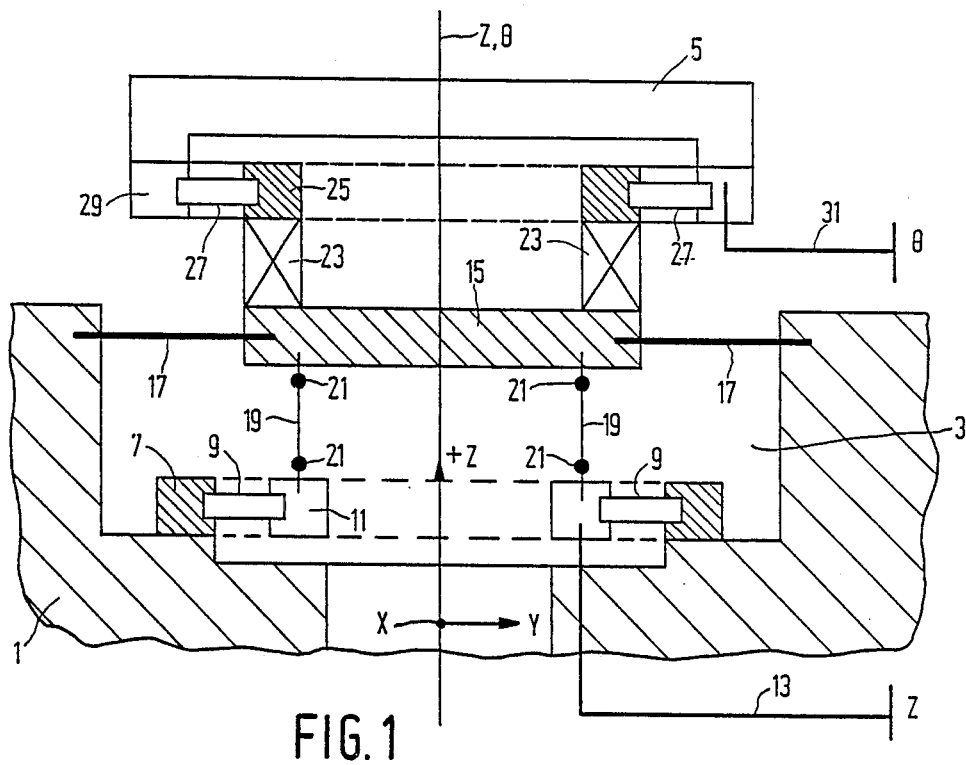
Figure 2:
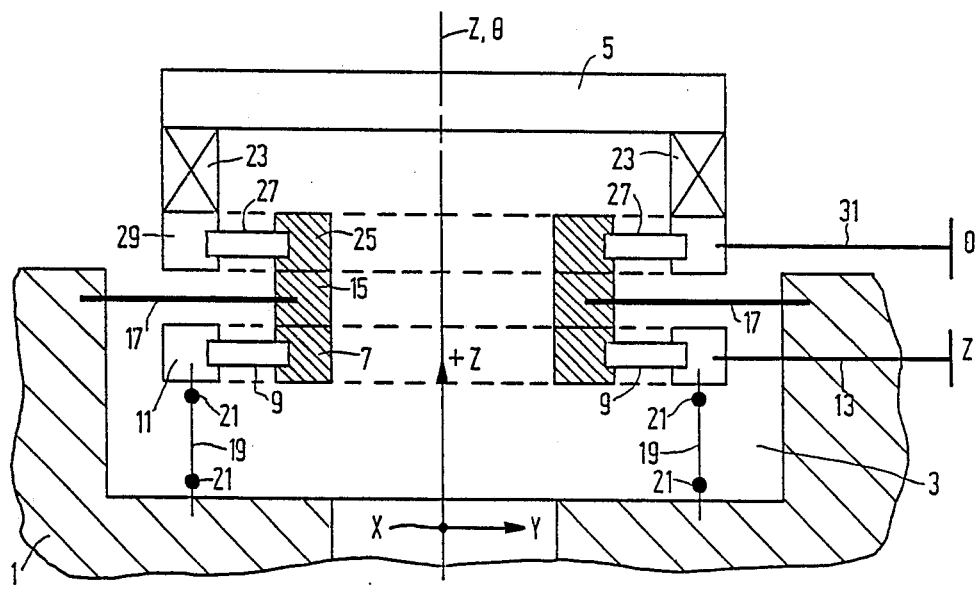
Figure 3:
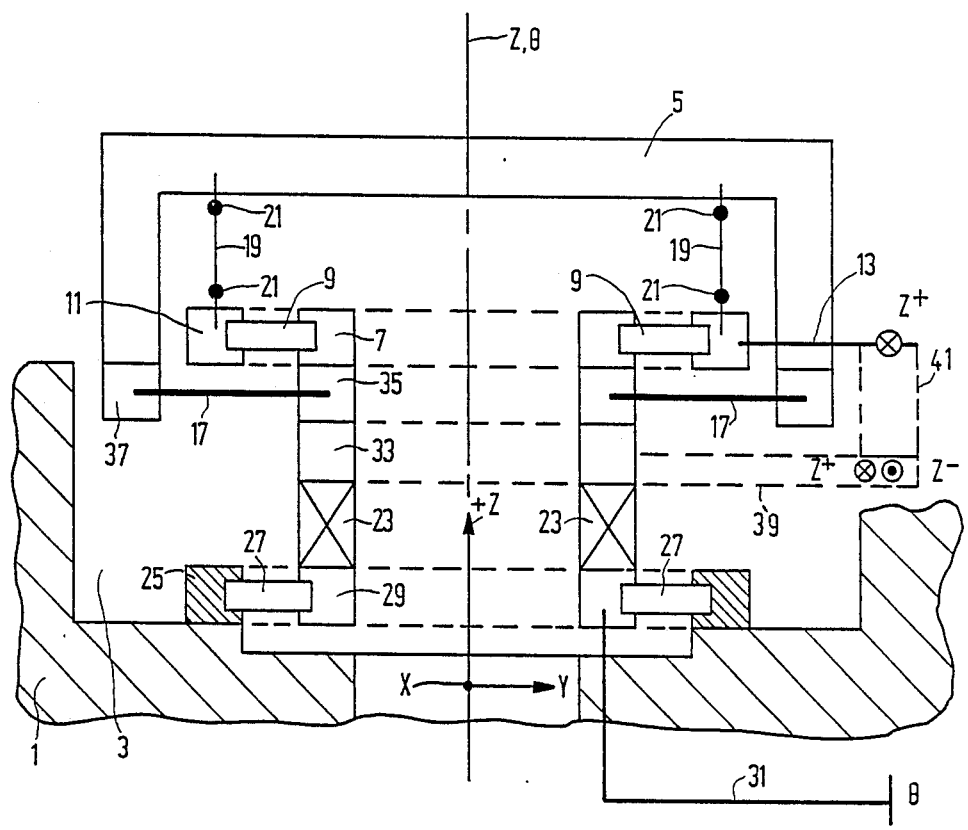

The first, second and third embodiments of the positioning device shown diagrammatically in FIGS. 1, 2 and 3, respectively, are provided, as far as possible, with (functionally) corresponding reference numerals. The description of FIGS. 1, 2 and 3 has for its object to provide an introduction, in which the principle of the invention is explained and outlined in greater detail, while support is given for the description of FIG. 4.

The first embodiment of the positioning device shown in FIG. 1 comprises a frame 1 fixedly arranged in an orthogonal coordinate system X,Y,Z. The frame 1 is provided with a circular-cylindrical chamber 3, which accommodates a so-called Z-manipulator. This Z-manipulator described more fully hereinafter serves to transmit a translation in the direction of the Z-axis to a table-shaped object holder 5. The Z-manipulator comprises an outer ring 7, which is secured to the frame 1 and is connected to an inner ring 11 through a number cf first elastic pivots 9 directed radially to the Z-axis. The outer ring 7 (outer section), the pivots 9 and the inner ring 11 (inner section) together constitute the first support of the Z-manipulator. The elastic pivots 9 can be constituted by blade springs as shown or by pivotable rods, will be explained more fully with reference to FIG. 4. The number of pivots 9 is two or more. The pivots 9 are arranged along the circumference of the rings 7 and 11 and do not admit a movement along the Z-axis of the inner ring 11 with respect to the outer ring 7. A first actuation member 13 in the form of a rod, by which a torque can be exerted, is secured to the inner ring 11. When a torque is exerted on the inner ring 11 by means of the first actuation member 13, the pivots 9 are elastically deformed and the inner ring 11 rotates relative to the outer ring 7 about an axis of rotation ($\theta$) coinciding with the Z-axis. The second support of the Z-manipulator is constituted by a circular disk 15, which is connected by means of a ring diaphragm 17 (separator) to the frame 1. The ring diaphragm 17 admits a translation along the Z-axis of the disk 15. By means of the first elastic rod-shaped coupling members 19, the disk 15 is secured to the inner ring 11. The coupling members 19 are provided with elastic pivots 21. With reference to FIGS. 6 and 8, the manner of securing and the shape of the coupling members 19, respectively, will be described more fully. It should now already be noted that the coupling members 19 may also be constituted by blade springs. In this case, the known Tomlinson element already mentioned in the preamble is concerned. The number of coupling members 19 is three or more. The coupling members 19 are arranged regularly along a circumference of the inner ring 11 and the disk 15. It should be noted that the so-called central planes of the rings 7 and 11 and the disk 15 are at right angles to the Z-axis. The centres of the rings 7 and 11 and of the disk 15 under all circumstances lie on the Z-axis.

Upon rotation of the inner ring 11 relative to the outer ring 7 about the axis of rotation ($\theta$), points on the coupling members 19 follow a helical track. The coupling members 19 prevent a tilting movement of the disk 15 so that its central plane remains parallel to the central plane of the rings 7 and 11. The disk 15 can therefore perform only a translation along the Z-axis. By means of second coupling members 23, the disk 15 is connected to a so-called $\theta$-manipulator. This $\theta$-manipulator comprises an inner ring 25, which is connected by second elastic pivots 27 to an outer ring 29, and constitutes a third support, on which the object holder 5 is secured. The pivots 27 areof the same kind as the pivots 9. The so-called central planes of the rings 25 and 29 are at right angels to the Z-axis. Their centres lie onthe Z-axis. The second coupling members 23 may be constituted by a rigid ring, but may alternatively be elastic and adjustable, as will be described more fully with reference to FIGS. 9 and 10. A secondactuation member 31 in the form of a rod is secured to the outer ring 29 of the θ-manipulator (third support). By means of the actuation member 31, a torque can be exerted on the outer ring 29, as a result of which the latter performs a relative rotation about the axis of rotation (θ) relative to the inner ring 25. For the sake of clarity, the parts not performing a rotation are indicated in FIG. 1 by hatched lines. This is also the case for FIGS. 2 and 3. It will be clear that with an activated first actuation member 13 of the Z-manipulator providing desired movement of the object holder 5 the ring diaphragm 17 acting as a separator prevents a rotation of the object holder 5 from taking place about the axis of rotation (θ) with a non-activated second actuation member 31 of the θ-manipulator. The Z-movement and the θ-movement are not dependent of each other and may be performed either sequentially or simultaneously. Due to the fact that all the connection members are constituted by elastically deformable members, the movements obtained by elastic deformations are in principle frictionless and hysteresis-free.

The second embodiment of the positioning device shown in FIG. 2 is distinguished from the first embodiment mainly in that the inner rings 7 and 25 of the Z-manipulator and the θ-manipulator, respectively, are identical. Thus, a simple construction is obtained, of which the part (7, 9,11,15,25,27,29) located near the ring diaphragm 17 is symmetrical to the ring diaphragm. Also in the second embodiment of the positioning device, the Z-movement and the θ-movement of the object holder 5 are independent of each other and may be performed either sequentially or simultaneously. The ring diaphragm 17 acting as a separator prevents both in the first and in the second embodiment that the rotation of the θ-manipulator is transferred to the Z-manipulator, but on the other hand it transfers the translation of the Z-manipulator to the complete θ-manipulator with the object holder.

The third embodiment of the positioning device shown in FIG. 3 is distinguished from the first and the second embodiment shown in FIG. 1 and FIG. 2, respectively, in that the Z-manipulator is arranged above the θ-manipulator (viewed in the direction of the positive Z-axis). The θ-manipulator is now situated in the chamber 3. Again the second coupling members 23 are secured to the inner ring 29 of the θ-manipulator. The coupling members 23 may be constituted by a rigid ring or by elastic adjustable members. The coupling members 23 are connected by two rings 33 and 35 to the inner ring 7 of the Z-manipulator. The ring diaphragm 17 is secured at its inner circumference to a ring 35 and at its outer circumference to a ring 37, which is connected to the object holder 5. In the case where the second coupling members 23 are constructed as a single rigid ring, the rings 7,35,33,23 and 29 may be replaced by a tube, the upper part of which constitutes the inner ring 7 of the first support of the Z-manipulator and the lower part of which constitutes the inner ring 29 of the θ-manipulator. It should be noted that the second support of the Z-manipulator is constituted in the embodiment shown in FIG. 3 by the object holder 5. The central planes of all rings 11, 7, 37, 35, 23, 29 and 25 are at right angles to the Z-axis. The centres of these rings all lie on the Z-axis, also during operation. An arm 39 indicated in FIG. 3 by dotted lines is secured to the ring 33 and on this arm is mounted a Z-actuator 41 cooperating with the second actuation member 13 of the Z-manipulator. The Z-actuator 41 may be, for example, an electromagnet, the coil of which is mounted on the arm 39 and the armature of which exerts a pressure force ($Z^+$) or a pulling force on the actuation member 13. The Z-actuator 11 may also be electrodynamic, in which event a displaceable coil exerts a force on the actuation member 13 and a permanent magnet is arranged on the arm 39. The reaction force $Z^-$ of a force $Z^+$ exerted on the actuation member 13 by a Z-actuator 41 naturally acts upon the arm 39. However, the force $Z^-$ is fully compensated for by a force $Z^+$ fed back to the arm 39 by the ring 11, the first coupling members 19, the object holder 5 and the ring diaphragm 17. The resulting force on the arm 39 is therefore zero. The system is effectively internally closed (neutral) in forces. Also in this case, the ring diaphragm 17 acts as a separator, though of another kind than in the embodiments shown in FIGS. 1 and 2. Whilst the ring diaphragm 17 transfers all rotations of the ring 29 directly on to the object holder 5 by the ring 37, translations along the Z-axis of the object holder 5 are neutralized by deformation in the direction of the Z-axis of the ring diaphragm 17. Consequently, no translations in the direction of the Z-axis are transferred from the Z-manipulator on to the θ-manipulator. The elastic pivots of the θ-manipulator do not admit a displacement of the ring 29 relative to the ring 25 in the direction of the Z-axis, as will be apparent from the following description.

The embodiments of the positioning device according to the invention shown in FIGS. 1, 2 and 3 have many variations, which are all based on the same principle. In general, a so-called kinematic conversion is possible within each pair of inner and outer rings located in the same plane and inner and outer sections, respectively, of a support both in the Z-manipulator and in the θ-manipulator. Fixedly arranged rings may be integrated in the frame. The object holder may be integrated with a ring to form a cup-shaped member instead of a disk-shaped member. The first and second coupling members may be in the form of a blade spring or in the form of a rod, while the first and second elastic pivots may be constituted by blade springs or rods and rod mechanisms, respectively, with integrated elastic pivots. The properties of the positioning device render this arrangement particularly suitable for measuring instruments and apparatus, in which objects must be manipulated with high precision in the Z-direction and in the θ-direction. Due to the frictionless and hysteresis-free construction, the positioning device is particularly suitable for displacements with an accuracy in the submicron range, especially if these displacements have to be carried out with a high repetition accuracy. The properties of the positioning device become manifest in a special manner with the use of the positioning device in a so-called optical lithographic device for the manufacture of integrated circuits.

Figure 4:
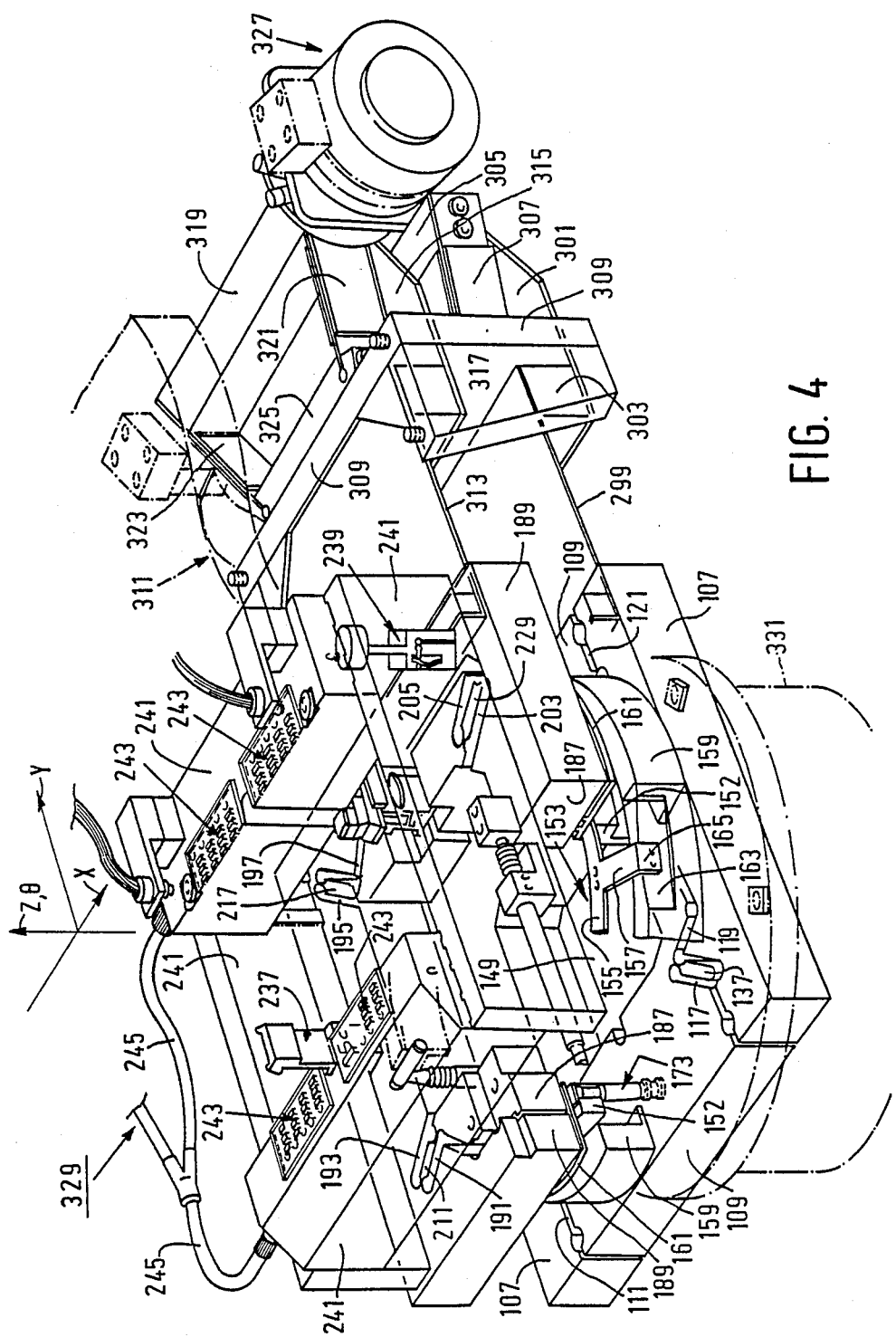

The positioning device which is shown in FIG. 4 and which corresponds to the first embodiment described with reference to FIG. 1 has a simply constructed, mechanically stable and comparatively favourably loaded separator. The positioning device shown in FIG. 4 is slightly adapted and has thus also been rendered suitable for integration in the optical lithographic device shown in FIG. 5. However, first the positioning device shown in FIG. 4 will be described with emphasis on the construction of the couplings between the various parts. Subsequently, in combination with FIG. 5 it will be explained how the positioning device is integrated in an optical lithographic device.

Figure 6A:
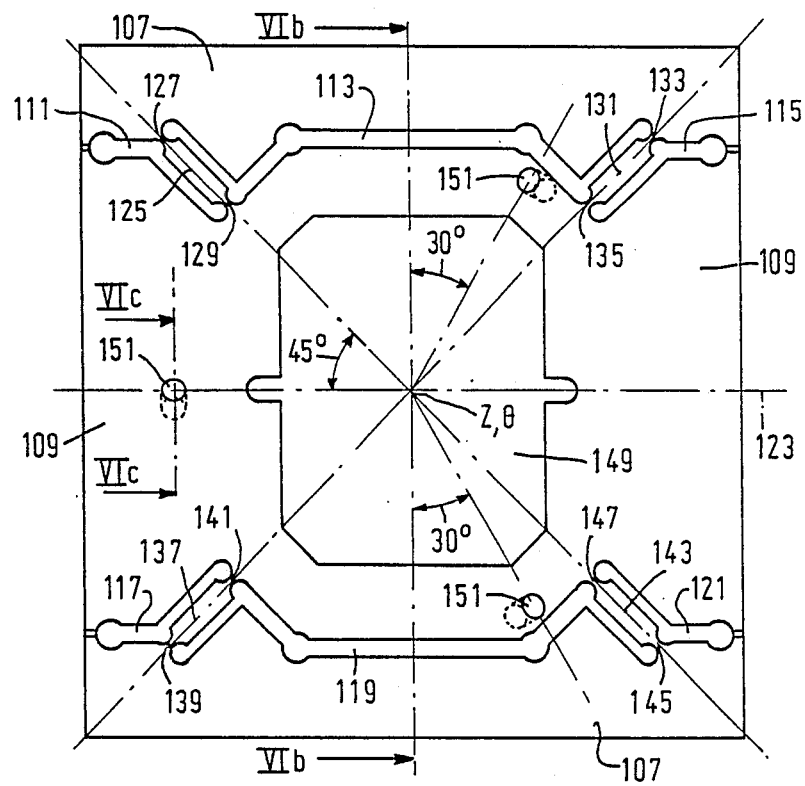
Figure 6B:
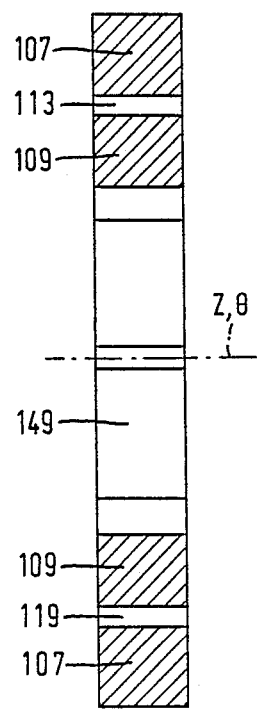
Figure 6C:
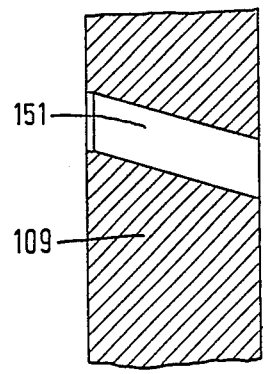

The positioning device shown in FIG. 4 comprises a Z-manipulator with a first support composed of a fixedly arranged outer section 107 and an inner section 109 rotatable with respect thereto about the axis of rotation (θ). Although the outer section 107 and the inner section 109 are not annular in the conventional-meaning, they should be considered to be comparable with, and equivalent in function to the outer ring 7 and the inner ring 11 as shown in FIG. 1. In FIG. 6, the first support of the Z-manipulator of the positioning device as shown in FIG. 4 is indicated in detail. This first support is formed by providing in a metal plate a number of cuts 111, 113, 115, 117, 119 and 121. The pattern of the cuts 111, 113 and 115 is identical to the pattern of the cuts 117, 119 and 121. Both patterns of cuts are symmetrical to a centre line 123 through and at right angles to the Z-axis. The cuts may be provided by electro-erosive metal-removing, milling or a laser treatment, between the cuts 111 and 113 and 115 and 113, respectively, material bridges are left, which act as rods which are pivotable. For example, a rod 125 with elastic pivots 127 and 129 is obtained between the cuts 111 and 113, while a rod 131 with elastic pivots 133 and 135 is obtained between the cuts 115 and 113. Between the cuts 117 and 119 and 121 and 119, respectively, there are also maintained material bridges acting as rods which are pivotable. For example, a rod 137 with elastic pivots 139 and 141 is obtained between the cuts 117 and 119, while a rod 143 with elastic pivots 145 and 147 is obtained between the cuts 121 and 119. The centre lines of the rods 125,143 and the rods 131,137, respectively, are aligned to each other and intersect perpendicularly the Z-axis. The centre lines of one pair of oppositely arranged rods intersect the centre lines of the other pair of oppositely arranged rods perpendicularly. The pivots 129,135, 147,141 and the pivots 127,133,145 and 139 therefore lie on two concentric circles with their centres on the Z-axis. The inner section 109 is further provided with an opening 149, whose function will appear below. The rods 125, 131, 143 and 137 together behave like a rod mechanism, by means of which the inner section 109 can be relatively rotated about the axis of rotation (θ) with respect to the outer section 107. In the present case, the outer section 107 is fixedly arranged and a torque about the Z-axis can be exerted on the inner section 109 by means of a first actuation member which will be described more fully with reference to FIG. 4. Due to the fact that the outer section 107, the inner section 109 and the rods with their pivots are made of plate metal as an integral construction, the first support may be statically overconstrained. In fact this is the case because four rods 125, 131, 143 and 137 are used instead of two rods. The advantage of four rods is the symmetrical construction and the comparatively high rigidity thus obtained. It should be noted that the plate metal of the first support has a thickness which yields rods and associated pivots with a comparatively high resistance to displacements parallel to the Z-axis of the inner section 109 relative to the outer section 107. The rods 125, 131, 143 and 137 consequently rotate only about axes parallel to the axis of rotation (θ). The inner section 109 rotated relative to the outer section 107 about the axis of rotation (θ) due to the fact that the elastic pivots 127, 133, 145, 139 and the elastic pivots 129, 135, 147 and 141 are arranged on concentric circles with their centres on the axis of rotation with an equal length of the rods 125, 131, 143 and 137. It may be needless to state that all the cuts in the first support of the Z-manipulatior extend throughout the thickness of the metal plate, as appears from the cuts 113 and 119 shown in FIG. 6b. The first support further has three circular securing holes 151 (cf. FIG. 6a), whose centre line encloses an acute angle with the central plane of the first support (cf. also FIG. 6c). The holes 151 are intended to be used for the aforementioned first elastic coupling members between the first and the second support of the Z-manipulator. Before the first elastic coupling members shown in FIGS. 4, 8a and 8b are further described, first the second support of the Z-manipulator will be described.

The second support of the Z-manipulator shown in FIG. 4 comprises a circular ring 152, which is arranged at a certain distance above the first support of the Z-manipulator. The so-called central plane of the ring 152 is at right angles to the Z-axis. The centre of the ring 152 lies on the Z-axis. A section of the θ-manipulator to be described further is secured to the ring 152. The ring 152 is screwed to a separator 153 constituted by a circular ring 155 with three flexible spokes 157 in the form of a blade spring directed radially with respect to the Z-axis. These spokes 157 are screwed to a further circular ring 159 secured to the outer section 107 of the first support of the Z-manipulator. It should be noted that the ring 152 acts as the disk 15 of FIG. 1, while the separator 153 acts as the ring diaphragm 17 of FIG. 1. Although in FIG. 4 the ring 159 seems to be fixed to the inner section 109 of the first support of the Z-manipulator, this is not the case. The inner section 109 can rotate freely relative to the ring 159, which is secured to the outer section 107. The ring 155 of the separator 153 is secured via a supporting ring 161 to the θ-manipulator. This supporting ring 161 is used in order that the Z-manipulator can be tested separately from the θ-manipulator. The ring 159 is provided with recesses, such as a recess 163 shown in FIG. 4, into which a flanged flap 165 of the spoke 157 is screwed. The length of the flap 165 is such that a part of the flap 165 projects above the ring 159. Thus, a spoke 157 can be bent and the ring 155 of the separator 153 can perform a displacement in the direction of the Z-axis. Although in FIG. 4 only one spoke 157 of the separator 153 is visible, the latter has three spokes arranged regularly along its outer circumference. The ring 152 acting as the second support of the Z-manipulator is provided with three securing holes, such as the securing hole 167, which correspond to the three securing holes 151 of the first support of the Z-manipulator (cf. also FIGS. 6a and 6c). Ends 169 and 171 of a first elastic rod-shaped coupling member 173 shown in FIG. 8 are glued in each of the three pairs of securing holes 151 and 167. The first elastic coupling member 173, which has a circular cross-section, is provided throughout its length with elastic pivots 175 and 177 in the form of local restrictions. The glue for securing the ends 169 and 171 in the holes 151 and 167 isapplied to glue surfaces 179 and 181 via a longitudinal conduit 183 and a transverse conduit 185. The conduit 185 merges at the area of a part having a diameter smaller than the diameter at the area of the glue surfaces 179 and 181 so that the glue can spread over the glue surfaces after the coupling member has been mounted in the securing holes. In the mounted state with an unloaded Z-manipulator, the centre lines of the three identical first elastic coupling members 173 enclose an angle of about 75° with a plane at right angles to the Z-axis. This angle is chosen so that a substantially linear load characteristic of the Z-manipulator is obtained. Upon rotation of the inner section 109 of the first support relative to the outer section 107 of the first support of the Z-manipulator about the axis ofrotation ($\theta$), the coupling members 173 are bent at the area of the elastic pivots 175 and 177. Points on the coupling members 173 then follow a helical track. The central plane of the ring 152 remains at right angles to the Z-axis. Dependent upon the direction of rotation of the inner section 109, the ring 152 is displaced upwards or downwards whilst the spokes 157 are bent simultaneously. The ring 152 cannot perform a rotation about the axis of rotation ($\theta$) due to the fact that the surfaces 165 are secured to the fixedly arranged ring 159. The manner in which a torque is exerted on the inner section 109 by means of a first actuation member for the Z-movement will be explained more fully hereinafter when also a similar actuation member for the $\theta$-manipulator is described.

The construction constituted by the combination of first support, first elastic coupling members and second support in principle forms a so-called Tomlinson element. Known Tomlinson elements have coupling members in the form of a blade spring between the first and the second support and are therefore statically overconstrained. Due to the choice of rod-shaped coupling members of circular cross-section, a construction is obtained which is statically contrained and which therefore does not cause unknown stresses varying in time due to temperature influences, shrinkage and shocks.

Figures 7A, 7B:
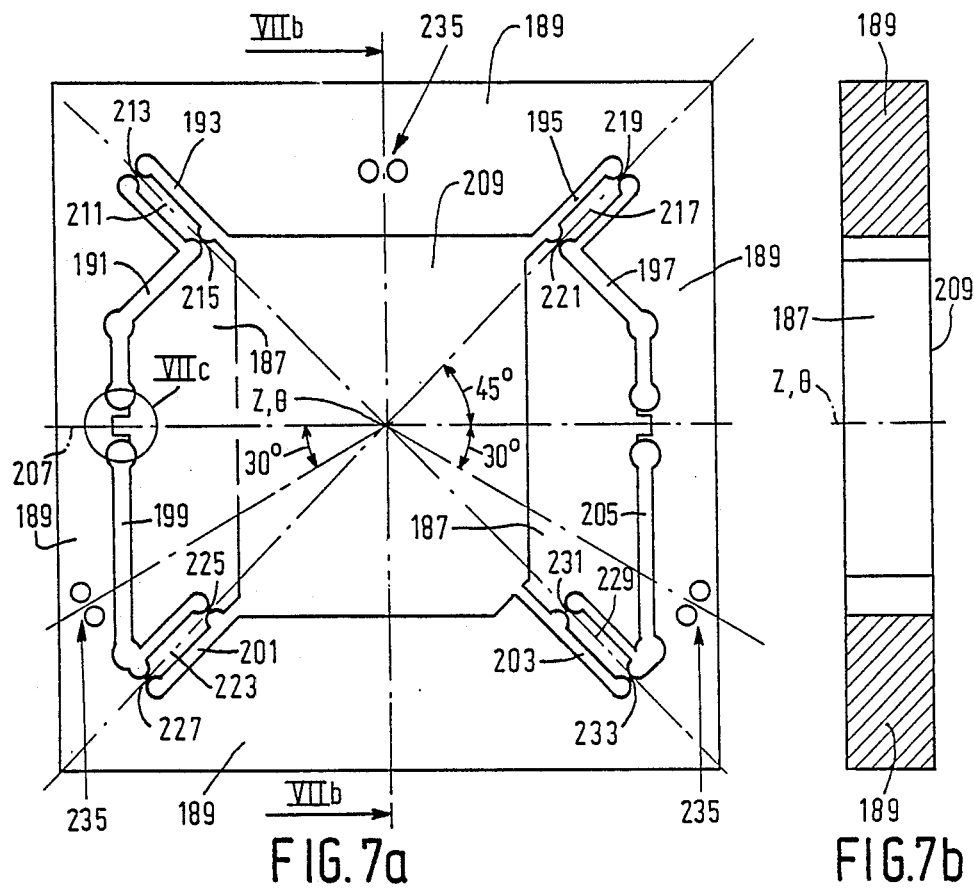
FIG. 7 shows a part of the $\theta$-manipulator in a positioning device as shown in FIG. 1 and FIG. 4.
Figure 7C:
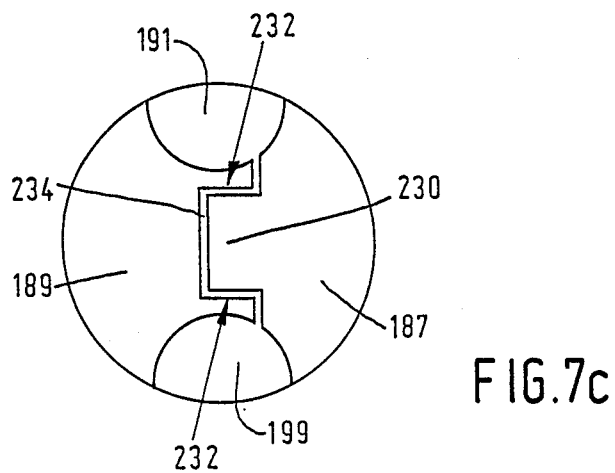

The ring 155 is secured together with the supporting ring 161 on the one hand to the annular second support 152 of the Z-manipulator and on the other hand to an inner section 187 associated with the third support constituting the $\theta$-manipulator. The third support further comprises an outer section 189, which is connected through elastic members to the inner section 187. The inner and outer sections of the third support shown in FIGS. 4, 7a and 7b are formed by providing in a metal plate a number of cuts 191, 193, 195, 197, 199, 201, 203 and 205, which extend throughout the thickness of the plate. The pattern of the cuts 191–197 is identical for the major part to the pattern of the cuts 199–205. Both patterns of cuts are substantially symmetrical to a centre line 107 through and at right angles to the Z-axis. The inner section 187 also has again an opening 209 for a purpose to be mentioned below. Between the cuts 191 and 193 and between the cuts 197 and 195, respectively, material bridges are left which act as pivotable rods. For example, a rod 211 with elastic pivots 213 and 215 is obtained between the cuts 191 and 193, while a rod 217 with elastic pivots 219 and 221 is obtained between the cuts 197 and 195. Also between the cuts 199 and 201 and between the cuts 205 and 203, respectively, material bridges are left which act as pivotable rods. For example, a rod 223 with elastic pivots 225 and 227 is obtained between the cuts 199 and 201, while a rod 229 with elastic pivots 231 and 233 is obtained between the cuts 205 and 203. The centre lines of the rods 211, 229 and of the rods 217, 223, respectively are aligned to each other and perpendicularly intersect the Z-axis. The centre lines of one pair of oppositely arranged rods perpendicularly intersect the centre lines of the other pair of oppositely arranged rods. The pivots 213, 219, 233, 227 and the pivots 215, 221, 231, 225 therefore lie on two concentric circles with their centres on the Z-axis. The rods 211, 217, 229 and 223 together behave like a rod mechanism, with which the outer section 189 can be relatively rotated about the axis of rotation ($\theta$) with respect to the inner section 187. In the present case, the inner section 187 is arranged to be locked against rotation and a torque about the Z-axis can be exerted on the outer section 189 by means of a second actuation member for the $\theta$-movement to be described more fully with reference to FIG. 4. Although the third support serving as the $\theta$-manipulator operates in principle in the same manner as the first support due to the rods 211, 217, 229 and 223 (cf. FIG. 7a) comparable with the rods 125, 131, 143 and 137 (cf. FIG. 6a) of the first support of the Z-manipulator, the inner and outer sections, respectively, of the two supports slightly deviate from each other. This is due to the fact that the first actuation member of the Z-manipulator is coupled to the inner section 109, while the second actuation member of the $\theta$-manipulator is coupled to the outer section 189. The coupling of the actuation members with the manipulators will be described more fully with reference to FIG. 4. The relative rotation about the axis of rotation ($\theta$) between the outer section 189 and the inner section 187 of the $\theta$-manipulator is limited in that a nose 230 on the inner section 187 constitutes an abutment for edges 232 in a recess 234 of the outer section 189.

As appears from FIG. 7a, the outer section 189 of the third support is provided with three pairs of holes 235. The pairs of holes 235 serve to secure three second elastic coupling members to the third support by mean of a screw connection. FIG. 4 shows only two of the three equally long coupling members, i.e. the coupling members 237 and 239. The third coupling member can be localized by observing the pairs of holes 235 of FIG. 7a in relation to FIG. 4. The coupling member 237, which will be described more fully with reference to FIG. 9 ($a,b$) differs from the coupling member 239 shown in FIG. 10 ($a,b$), of which two specima are present. The coupling members 237 and 239 are secured near one end by screw connections in the holes 235 of the outer section 189 of the third support serving as the $\theta$-manipulator and are secured near the other end by a glue connection to an object holder 241 (cf. FIG. 4). The coupling members 237,239 and the object holder 241 correspond to the coupling members 23 and the object holder 5, respectively, of FIG. 1. The object holder 241 has the shape of a rectangular frame and is provided with engagement surfaces 243 for, for example, a flat object, which can be connected by means of flexible hoses 245 to a vacuum source. The coupling members 237 and 239 provide an additional positioning possibility for the object holder 241 besides the Z-translation and $\theta$-rotation supplied by the Z-manipulator and the $\theta$-manipulator respectively. The said positioning possibility consists in a tilting movement of the object holder 241, which can be considered to be composed of a tilting movement about an axis parallel to the X-axis and of a tilting movement about an axis parallel to the Y-axis. This tilting possibility can be uitilized to adjust the plane through the engagement surfaces 243 at right angles to the Z-axis if for some reason or other the Z-axis encloses an angle with the said plane which deviates from 90°. In this connection, for example, it should be mentioned that a deviating angle may be present due to manufacturing and/or mounting tolerances in the Z-manipulator and/or the $\theta$-manipulator. By means of the coupling members 237 and 239, it may further be prevented that too high mechanical stresses occur in the object holder 241, which may be made in part or entirely of glass, for example for use in an optical lithographic device. Such stresses may be produced by the difference in expansion coefficients of the materials of the object holder and the metal of the outer section 189 of the θ-manipulator. The double function described of the three elastic coupling members 237 and 239 will be explained with reference to FIGS. 9 (a,b) and 10 (a,b), in which the coupling member 237 and the coupling members 239 (two), respectively, are shown in detail.

The coupling member 237 shown in FIG. 9 comprises an upper securing block 247 and a lower securing block 249, which are interconnected by a blade spring 251. The blocks 247, 249 and the blade spring 251 form an integral construction, which is made of one piece of metal. The lower securing block 249 is provided with two cuts 253 and 255 (cf. FIG. 9b), as a result of which a material bridge 257 is left which acts as an elastic pivot with a pivot shaft 259, which is at right angles to the plane of the blade spring 251. The coupling member 237 is further provided with two screw-holes 261, by which the securing block 249 is secured to the outer section 189 of the θ-manipulator by a pair of holes 235. The upper securing block 247 is glued to the object holder 241.

The coupling member 239 shown in FIG. 10 comprises an upper securing block 263 and a lower securing block 265, which are interconnected by a blade spring 267. The blocks 263, 265 and the blade spring 267 form an integral construction, which is made of one piece of metal. The lower securing block 265 is provided with two cuts 269 and 271 (cf. FIG. 10a) and with two further cuts 273 and 275 at right angles to the cuts 269 and 271 (cf. FIG. 10b). Due to the four cuts 269–275, a comparatively thin elongate material bridge 277 is left, which acts as a double elastic pivot with a first pivot axis 279 at right angles to the plane of the blade spring 267 and a second pivot axis 281 parallel to the plane of the blade spring 267. The pivot axis 279 and 281 (cf. FIGS. 10a and 10b, respectively) intersect each other perpendicularly. The lower securing block 265 is further provided with a fifth cut 283 parallel to the plane of the blade spring 267. As a result, an arm 285 is obtained, by means of which the material bridge 277 can be twisted about the pivot axis 281. This has the effect of a bending moment exerted on the lower end of the blade spring 267. The lower end of the blade spring 267 thus performs a displacement in the Z-direction which is proportional to the distance A indicated in FIG. 10b between a plane through the pivot axis 281 parallel to the plane of the blade spring and a plane through the centre line of the blade spring parallel to the plane of the blade spring. The arm 285 is provided with a screw hole 287, which is centred with respect to a supporting hole 289 in the securing block 265. When a bolt is screwed into the hole 287 until it engages with a given force in the supporting hole 289, the width of the cut 283 can be varied and hence the extent of deformation of the material bridge 277 acting as an elastic pivot can also be varied. The lower securing block 265 is further provided with two oppositely arranged grooves 291 and 293, in which the blade spring 295 is supported. The pre-tension of the blade spring 295 yields such a deformation of the material bridge 277 that it can be enlarged or reduced by means of the arm 285. Thus, a displacement both in the positive and in the negative Z-direction of the blade spring 267, of the upper securing block 263 and of the object holder 241 can be obtained. It is then assumed that the lower securing block 265 is fixedly arranged in the Z-direction. The coupling member 239 is further provided with screw holes 297 (only one of which is shown in FIG. 10b), with which the lower securing block 265 can be secured to the outer section 189 of the θ-manipulator by a corresponding pair of holes 235. The upper securing block 263 is glued to the object holder 241.

It should be noted that the blade springs 251 and 267 of the coupling members 237 and 239, respectively form with their planes vertical in the neutral position the tangent planes of a circle with its centre on the Z-axis.

Due to the active adjustment parallel to the Z-axis of the adjustable coupling members 239, a tilting movement of the object holder 241 about an axis parallel to the X-axis can be obtained with oppositely direct adjustments of the coupling members 239, while a tilting movement about an axis parallel to the Y-axis can then be obtained with equally directed adjustments of the coupling members 239. This tilting axis parallel to the Y-axis is parallel to the plane of the blade spring 251 of the coupling member 237, while the tilting axis parallel to the X-axis is at right angles thereto. The adjustment provided by the three coupling members, prevents large mechanical stresses from occurring in the object holder 241. The second elastic coupling members 237 and 239 therefore provide an additional adjustment possibility for the positioning device, which has particular advantages with the use in optical lithographic equipment to be described more fully hereinafter.

The first actuation member of the Z-manipulator and the second actuation member of the θ-manipulator are in principle of the same kind and can be activated either sequentially or simultaneously. The Z-movement and the θ-movement are independent of each other. Both actuation members will be described more fully with reference to FIG. 4.

The first actuation member, by means of which a relative rotation is obtained about the axis of rotation (θ) of the inner section 109 of the first support of the Z-manipulator with respect to the outer section 107, has two parallel plate springs 299 and 301, of which the planes are at right angles to the Z-axis. The plate springs 299 and 301 are secured to each other by a rigid coupling beam 303. The plate spring 299 is secured by means of screw connections to the inner section 109 of the first support of the Z-manipulator, while the plate spring 301 is secured to a bridge 305. The beam-shaped bridge 305 extends and is also displaceable in the direction tengential to a circle whose centre lies on a line of intersection parallel to the Z-axis of two blade springs (only one blade spring 307 is shown in FIG. 4), which are secured at one end to the bridge 305 and are secured at the other end by a further beam-shaped bridge (not shown) to a fixedly arranged frame 309. An electrodynamic actuator 311 of a known kind indicated in FIG. 4 by a dot-and-dash line is used to exert by means of a displaceable coil support a force on the bridge 305 in a direction parallel to the centre line of this bridge.

The second actuation member with which a relative rotation is obtained about the axis of rotation (θ) of the outer section 189 of the third support acting as the θ-manipulator with respect to the inner section 187 of this support, has two parallel plate springs 313 and 315, of which the planes are at right angles to the Z-axis. The plate springs 313 and 315 are secured to each other by a rigid coupling beam 317. The plate spring 313 is secured by means of screw connections to the outer section 189 of the third support or θ-manipulator, while the plate spring 315 is secured to a bridge 319. The beam-shaped bridge 319 extends and is also displaceable in a direction tangential to a circle whose centre lies on a line of intersection parallel to the Z-axis of two blade springs 321 and 323, which are secured at one end to the bridge 319 and are secured at the other end by a further beam-shaped bridge 325 to the frame 309. The centre lines of the beam-shaped bridges 305, 319, 325 and of the beams 303 and 317 are parallel to each other. An electrodynamic actuator 327 of the same kind as the actuator 311 is used to exert a force on the bridge 319 parallel to the centre line of this bridge.

For both actuation members it holds that due to the torsionally stiff connections of the bridges 305 and 319 with the frame 309 and the torsionally weak connections of these bridges with the inner section 109 and the outer section 189, respectively, only a pure torque is transmitted to this section by the actuators 311 and 327. Eventual transverse forces parallel to the X- or Y-axis are transmitted to the frame 309, but are not or substantially not transmitted to the sections 109 and 189. This is an important property of the actuation members, which renders the positioning device particularly suitable for use in optical lithographic devices, in which forces transverse to the optical axis (Z-axis) of a lens system have to be avoided as far as possible.

Figure 5:
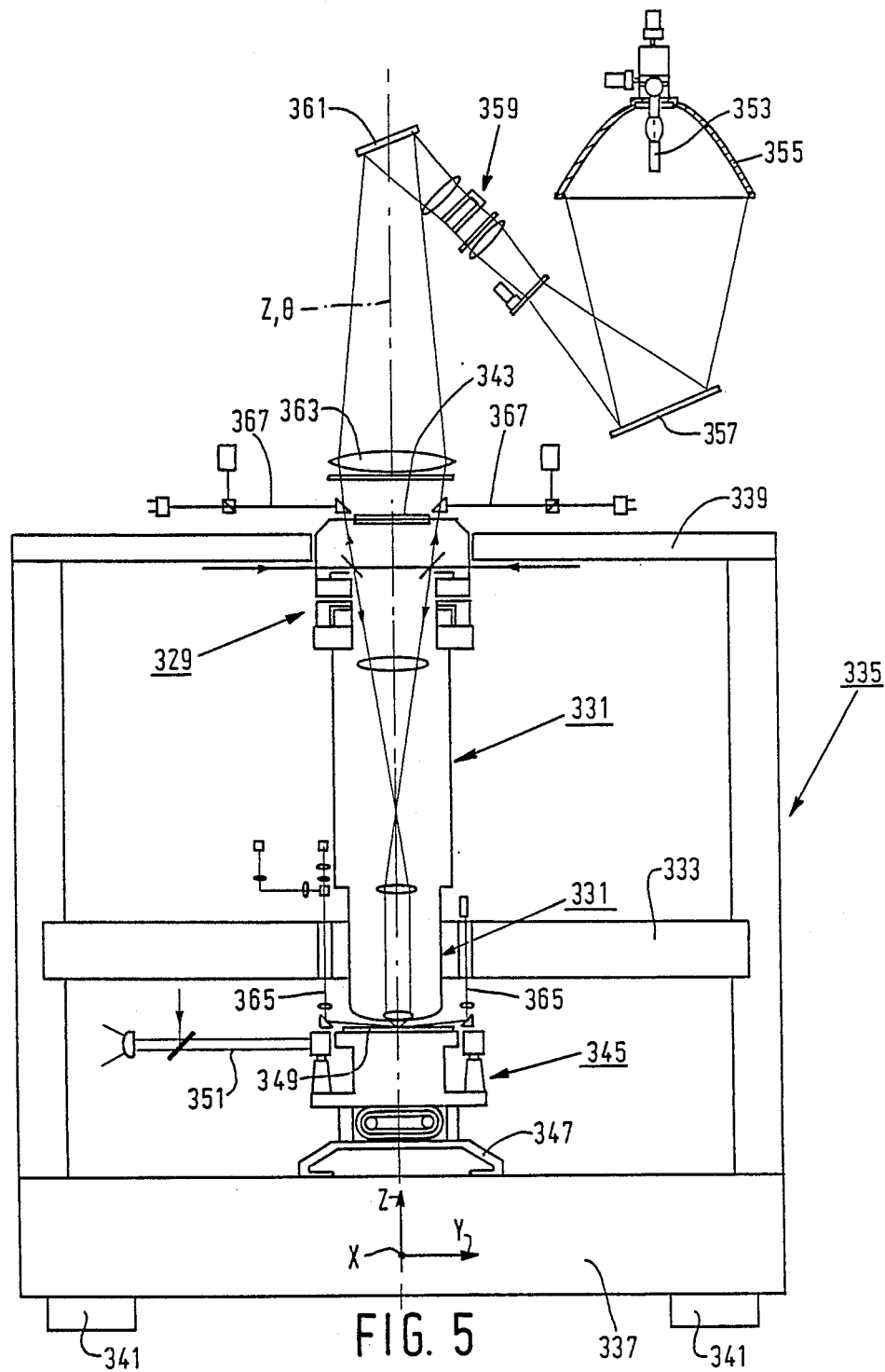

Such an optical lithographic device according to the invention, in which the properties of the positioning device according to the invention as described with reference to FIGS. 1, 2, 3, 4, 6, 7, 8, 9 and 10 become manifest in a special manner, is shown in FIG. 5. The device shown in FIG. 5 is used in the manufacture of integrated circuits and in fact forms a step and repeat optical projection system, or so-called waferstepper, having a Z-manipulator and a θ-manipulator. The manipulator denoted in FIG. 5 by reference numeral 329 is of the kind as described with reference to FIG. 4, a projection lens 331 being secured to the fixedly arranged outer section 107 of the first support of the Z-manipulator. This is indicated diagrammatically in FIG. 4 by a dot-and-dash line. The projection lens 331 (cf. FIG. 5) is fixedly arranged with its lens holder in a so-called objective plate 333, which forms part of a frame 335 of the optical lithographic device. A very flat granite plate 337 and an upper plate 339 also form part of the frame 335. The granite plate 337 extending in a horizontal plane at right angles to the Z-axis is disposed on adjustable supports 341. The frame 335 is arranged so that the optical axis of the projection lens 331 coincides with the Z-axis. The engagement surfaces 243 (cf. FIG. 4) of the object holder 241 now serve to support a mask 343 (cf. FIG. 5). An X,Y-carriage carriage 345 of a known kind (see European Patent Application No. 0 109 718-A1 to which U.S. Pat. No. 4,655,594 corresponds) with an air foot 347 guided over the granite plate 337 is present below the projection lens 331. A semiconductor substrate 349 with a photosensitive lacquer to be repeatedly exposed is arranged on the carriage 345. The exposure of the substrate 349 takes place in a number of different positions of the carriage 345 with respect to the projection lens 331. A known measuring system 351 with laser interferometers (see U.S. Pat. No. 4,251,160) serves for positioning the carriage 345. A light source 353 with a parabolic reflector 355 is arranged above the plate 339. Via a mirror 357, a diaphragm section 359, a mirror 361 and a condenser lens 363, the light is guided to the mask 343. By the projection lens 331, the mask 343 is imaged on the substrate 349. It should be noted that the aforementioned openings 149 and 209 (cf. FIGS. 6a and 7a) serve in the present application to allow the light to pass. The image of the mask 343 is focused on the substrate 349 by means of a known focusing system 365 (see U.S. Pat. No. 4,356,392). Both the mask 343 and the substrate 349 are provided with two alignment markers with, for example, X,Y-gratings. These alignment markers serve to register or align the mask with respect to the substrate, use being made of an alignment system 367 (see Netherlands Patent Application No. 8600639, which is the priority application for U.S. patent application Ser. No. 910,710 filed Sept. 24, 1986). The alignment system 367 detects when the alignment markers on the mask and on the substrate cover each other in projection, while the measuring system 351 determines how large are the horizontal displacements of the carriage 345 in the X- and Y-direction which were required to this end. From these data, both the required angle Δθ for the alignment of the mask with respect to the substrate and the value of the relative translation in the Z-direction of the mask and the lens required to obtain the correct enlargement are calculated. By means of the positioning arrangement 329, the mask 343 is then rotated with respect to the substrate 349 about the axis of rotation (θ) (θ-manipulator) and translated in the direction of the Z-axis (Z-manipulator) until a perfect registration and a correct enlargement are obtained. It is then assumed that the mask and the substrate had been arranged parallel to each other already beforehand by means of the coupling members 237 and 239 (cf. FIG. 4). The tilting movement of the object holder 241 already described above permits of tilting the mask in such a manner with respect to the substrate that the image plane is at right angles to the optical axis (Z-axis) of the projection lens. This is of great importance because a distortion of the image is thus avoided. It should be noted that the positioning devices described above are particularly suitable for a very accurate manipulation of objects as far as in the submicron range. Due to the fact that all the displacements are obtained free from play by means of elastic deformation, the construction is substantially frictionless and moreover free from hysteresis.

What is claimed is:

1. A positioning device comprising a Z-manipulator for translation in a predetermined axis of an orthogonal coordinate system, said Z-manipulator comprising a first support and a second support, said first support being rotatable about said predetermined axis with respect to said second support, an object holder which is displaceable by means of the Z-manipulator in the predetermined axis, means connecting said object holder to one of said supports for providing said object holder with a substantially frictionless and hysteresis-free translational movement in said predetermined axis, a θ-manipulator for rotation about said predetermined axis, means connecting said object holder to said θ-manipulator for providing said object holder with substantially frictionless and hysteresis-free rotation about said predetermined axis, first elastic coupling members, said first and second supports being secured to each other by said first elastic coupling members, one of said two supports occupying a fixed position along the predetermined axis of the coordinate system, wherein separator means which is elastically deformable in the direction of the predetermined axis couples the Z-manipulator to the θ-manipulator, and whereby due to elastic deformation of said first elastic coupling members, said separator means upon relative rotation of said first support with respect to said second support produces a translation of the object holder in the direction of the predetermined axis without rotation of the object holder about said predetermined axis.

2. A positioning device as claimed in claim 1, including a fixedly arranged part and wherein said separator means has a flat ring which is secured to said second support of the Z-manipulator and the center of whcih lies in the predetermined axis, said predetermined axis being at right angles to a plane through said ring, said second supports being connected to said θ-manipulator, said ring including flexible spokes each in the form of blade spring means connecting said ring to said fixedly arranged part of the positioning device and preventing rotation about said predetermined axis of said second support of the Z-manipulator when said θ-manipulator is rotated.

3. A positioning device as claimed in claim 1, including a third support between said object holder and said second support, said third support being rotatable as said θ-manipulator with respect to said second support whereby said object holder can be rotated about said predetermined axis without translational movement along said predetermined axis.

4. A positioning device as claimed in claim 1, including a fixedly arranged part and wherein the θ-manipulator is supported by the Z-manipulator, said first support of said Z-manipulator having an inner section and an outer section, said inner section being rotatble with respect to said outer section, said outer section being connected to said fixedly arranged part, said device including first elastic pivots deformable in a plane at right angles to the predetermined axis and connecting said inner section to said outer section, said inner section and said outer section and said first elastic pivots being formed from one piece of plate metal as an intergral construction, said second support being connected through said first elastic coupling members to said inner section of said first support, said second support being above said first support, said separator means and said fixedly arranged part connecting said second support to said outer section of said first support, a third support above the second support, said third support having an inner section and an outer section and supporting said object holder, and second coupling members coupling the inner section of said third supports to said second support and second elastic pivots connecting said outer section of said third support to its associated inner section, said thrid support acting as said θ-manipulator, said inner and outer sections of said third support and said second elastic pivots being constructed of one piece of plate metal as an integral construction.

5. A positioning device as claimed in claim 1, wherein said first and second supports have bores and the first elastic coupling members between said first and second supports of the Z-manipulator are in the form of circular, cylindrical rods with two ends, each rod provided near its two ends with an elastic pivot, said ends being secured in said bores in said first and second supports, said rods having center lines which enclose an acute angle with a line perpendicular to said supports and parallel to the predetermined axis.

6. A positioning device as claimed in claim 3, wherein said second coupling members between said second and third supports are elastically deformable and comprises three blade springs, each blade spring having a first elastic pivot with a pivot shaft at right angles to the plane of its respective blade spring, a plurality of said blade springs having a second elastic pivot, the pivot shaft of each of said plurality being parallel to the plane of its respective blade spring and crossing its center line perpendicularly.

7. A positioning device as claimed in claim 1 including a fixedly arranged frame, a first actuation member, a second actuation member, a bridge for each actuation member and a pair of plates for each bridge secured to each other, said first actuation member translating the object holder along said predetermined axis, said second actuation member providing rotation of the object holder about said predetermined axis, each said actuation member comprising a pair of bladfe springs, each said pair of blade springs lying in planes intersecting each other along a line parallel to the predetermined axis, each blade spring having two ends, one end of each blade spring of each pair of blade springs being clamped in said fixedly arranged frame, the other ends of each pair of blade springs being secured to one of said bridges, each of said bridges being displaceable in a direction tangential to a circle whose center lies on said line of intersection parallel to said predetermined axis, each said pair of plates connecting its associated bridge to the respective Z-manipulator and θ-manipulator, said plates lying in planes which are at right angles to the predetermined axis.

8. An optical lithographic device movable in X, Y, and Z axes in an orthogonal coordinate system for the manufacture of integrated circuits comprising viewed in the direction of projection, in order of succession, a light source, a diaphragm, a condenser lens, a positioning device comprising a Z-manipulator for translation in the Z-axis of said orthogonal coordinate system; a lens holder fixedly arranged and secured to the Z-manipulator and having an optical projection lens with an optical axis coinciding with said Z-axis, and an X,Y table means arranged below the projection lens for translation in the X- and the Y-axes for repeated exposure of a substrate, said positioning device comprising a first support and a second support, said first support being rotatable about said Z-axis with respect to said second support, an object holder which is dispalceable by means of the Z-manipulator in the Z-axis, means connecting said object holder to one of said supports for providing a substantially frictionless and hysteresis-free translatory movement, a θ-manipulator for rotation about said Z-axis, means connecting said object holder to said θ-manipulator for providing substantially frictionless and hysteresis-free rotation about said Z-axis, first elastic coupling members, said first and second supports being secured to each other by said first elastic coupling members, one of said first and second supports occupying a fixed position along the Z-axis of the coordinate system, wherein a separator means which is elastically deforamble in the direction of the Z-axis couples the Z-manipulator to the θ-manipulator whereby, due to elastic deformation of said first elastic coupling members, said separator means upon relative rotation of said first support with respect to said second support produces a translation of the object holder in the direction of the Z-axis without rotation of the object holder about the Z-axis and wherein said positioning device also includes a third support between said object holder and said second support, said third support being rotatable as said θ-manipulator with respect to said second support whereby said object holder can be rotated about said Z-axis without trasnlational movement along said Z-axis, said positioning device further comprising a fixedly arranged part, said θ-manipulator being supported by the Z-manipulator, said first support of said Z-manipulator having an inner section and an outer section, said inner section being rotatable with respect to said outer section, said outer section being connected to said fixedly arranged part, said positioning device including first elastic pivots deformable in a plane at right angles to the Z-axis and connecting said inner section to said outer section, said inner section and said outer section and said first elastic pivots being formed from one piece of plate metal as an integral construction, said inner section being connected through said first elastic coupling members to said second support, said second support being above said first support, said separator means and said fixedly arranged part connecting said second support to said outer section of said first support, said third support being above said second support, said third support supporting said object holder and having an inner section and an outer section, second coupling members coupling the inner section of said third support to said second support and second elastic pivots connecting said outer section of said third support to its associated inner section, said inner and outer sections of said third support and said second elastic pivots acting as said θ-manipulator and being constructed of one piece of plate metal as an integral construction, said object holder being provided with a mask support having an engagement surface which is at right angles to said predetermined axis.

9. A positioning device for moving an object along a predetermined axis, said device including a first and second support, said first support being rotatable with respect to said second support, an object holder supported by said second support, elastic coupling means connecting said first support to said second support, said elastic coupling means bending in response to rotation of said first support, and separator means preventing rotation of said second support and being movable along said predetermined axis, said separator means moving said second support and said object holder along said predetermined axis in response to rotation of said first support, said first support having an inner section and an outer section, said inner section being rotatable with respect to said outer section and wherein said device includes first elastic pivots deformable in a plane at right angles to the predetermined axis and connecting said inner section to said outer section, said inner section and said outer section and said first elastic pivot being formed from one piece of plate metal as an intergral construction.

10. A positioning device as in claim 9, including a third support between said object holder and said second support, said third support being rotatable with respect to said second support whereby said object holder can be rotated about said predetermined axis.

11. A positioning device as claimed in claim 10, wherein said third support has an inner section and an outer section and second elastic pivots connect said outer section of said third support to its associated inner section, said inner and outer sections of said third support and said second elastic pivots being constructed of one piece of plate metal as an integral construction.

* * * * *